(12) United States Patent
Sinha et al.

(10) Patent No.: US 10,090,133 B2
(45) Date of Patent: *Oct. 2, 2018

(54) BORON-CONTAINING DOPANT COMPOSITIONS, SYSTEMS AND METHODS OF USE THEREOF FOR IMPROVING ION BEAM CURRENT AND PERFORMANCE DURING BORON ION IMPLANTATION

(71) Applicant: Praxair Technology, Inc., Danbury, CT (US)

(72) Inventors: Ashwini K Sinha, East Amherst, NY (US); Stanley M Smith, Clarence Center, NY (US); Douglas C Heiderman, Akron, NY (US); Serge M Campeau, Orchard Park, NY (US)

(73) Assignee: PRAXAIR TECHNOLOGY, INC., Danbury, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/293,367

(22) Filed: Oct. 14, 2016

(65) Prior Publication Data

US 2017/0032941 A1 Feb. 2, 2017

Related U.S. Application Data (63) Continuation of application No. 14/982,544, filed on Dec. 29, 2015, now Pat. No. 9,548,181, which is a
(Continued)

(51) Int. Cl.
*H01J 37/31* (2006.01)
*H01J 37/317* (2006.01)
(Continued)

(52) U.S. Cl.
CPC ............ *H01J 37/3171* (2013.01); *C01B 3/00* (2013.01); *H01J 27/22* (2013.01); *H01J 37/08* (2013.01);
(Continued)

(58) Field of Classification Search
CPC .. H01J 37/3171; H01J 37/08; H01J 37/32458; H01J 37/32807;
(Continued)

(56) References Cited

U.S. PATENT DOCUMENTS

| 2,787,564 A | 4/1957 | Shockley et al. |
| 5,061,322 A | 10/1991 | Asano et al. |

(Continued)

FOREIGN PATENT DOCUMENTS

| CN | 101558183 A | 10/2009 |
| CN | 103137542 A | 6/2013 |
| CN | 103165465 A | 6/2013 |

OTHER PUBLICATIONS

ATMI VAC(TM) Package. User Guide for Ion Implantation. Marketing Brochure, http://web.archive.org/web/20120203135839/http://mathesongas.com/pdfs/products/User-Guide-for-VAC-Package.pdf—Feb. 3, 2012 (Wayback Machine).

(Continued)

*Primary Examiner* — David E Smith
(74) *Attorney, Agent, or Firm* — Nilay S. Dalal (57) ABSTRACT

A novel composition, system and method for improving beam current during boron ion implantation are provided. In a preferred aspect, the boron ion implant process involves utilizing B2H6, 11BF3 and H2 at specific ranges of concentrations. The B2H6 is selected to have an ionization cross-section higher than that of the BF3 at an operating arc voltage of an ion source utilized during generation and implantation of active hydrogen ions species. The hydrogen allows higher levels of B2H6 to be introduced into the BF3 without reduction in F ion scavenging. The active boron ions produce an improved beam current characterized by maintaining or increasing the beam current level without incurring degradation of the ion source when compared to a beam (Continued)

Cathode and anode weight gain/loss summary

| Dopant Gas Composition | Cathode weight gain/loss rate | Anode weight gain/loss rate |
|---|---|---|
| $^{11}BF_3$ only | +28.5 mg/hr | – |
| $^{11}BF_3$ + Xe/$H_2$ | +1.43 mg/hr | −0.75 mg/hr |
| 97.5% $^{11}BF_3$ + 2.5% $B_2H_6$ | +0.3 mg/hr | −5.1 mg/hr |
| 90% $^{11}BF_3$ + 5% $B_2H_6$ + 5% $H_2$ | −2.5 mg/hr | −1.1 mg/hr |
| 92% $^{11}BF_3$ +3% $B_2H_6$ + 5% $H_2$ | −0.6 mg/hr | −0.9 mg/hr | current generated from conventional boron precursor materials.

14 Claims, 7 Drawing Sheets

Related U.S. Application Data continuation-in-part of application No. 14/635,413, filed on Mar. 2, 2015, now Pat. No. 9,570,271.

(60) Provisional application No. 61/947,064, filed on Mar. 3, 2014.

(51) Int. Cl.
  *H01J 37/08* (2006.01)
  *H01J 27/22* (2006.01)
  *C01B 3/00* (2006.01)
  *H01J 37/32* (2006.01)

(52) U.S. Cl.
  CPC .. *H01J 37/32458* (2013.01); *H01J 37/32807* (2013.01); *H01J 2237/006* (2013.01); *H01J 2237/0473* (2013.01); *H01J 2237/08* (2013.01); *H01J 2237/0815* (2013.01); *H01J 2237/31701* (2013.01); *H01J 2237/3365* (2013.01); *Y02E 60/324* (2013.01)

(58) Field of Classification Search
  CPC ......... H01J 2237/006; H01J 2237/0473; H01J 2237/08; H01J 2237/0815; H01J 2237/31701; H01J 2237/3365; C01B 3/00; Y02E 60/324
  See application file for complete search history.

(56) References Cited

U.S. PATENT DOCUMENTS

| | | | |
|---|---|---|---|
| 5,395,783 A | 3/1995 | Baumann et al. | |
| 5,937,895 A | 8/1999 | Le Febre et al. | |
| 5,940,724 A | 8/1999 | Warren et al. | |
| 6,007,609 A | 12/1999 | Semerdjian et al. | |
| 6,045,115 A | 4/2000 | Martin, Jr. et al. | |
| 6,089,027 A | 7/2000 | Wang et al. | |
| 6,101,816 A | 8/2000 | Wang et al. | |
| 6,132,492 A | 10/2000 | Hultquist et al. | |
| 6,511,760 B1 | 1/2003 | Barone et al. | |
| 7,301,160 B2 | 11/2007 | Banks et al. | |
| 7,494,530 B2 | 2/2009 | Carruthers et al. | |
| 7,586,109 B2 | 9/2009 | Perel et al. | |
| 7,655,931 B2 | 2/2010 | Gupta et al. | |
| 7,708,028 B2 | 5/2010 | Brown et al. | |
| 7,905,247 B2 | 3/2011 | Campeau et al. | |
| 7,943,204 B2* | 5/2011 | Olander | H01J 37/08 427/523 |
| 7,973,293 B2 | 7/2011 | Lin et al. | |
| 8,062,965 B2 | 11/2011 | Kaim et al. | |
| 8,237,134 B2* | 8/2012 | Kaim | H01J 37/08 250/492.21 |
| 8,389,068 B2 | 3/2013 | Olander et al. | |
| 8,522,817 B1 | 9/2013 | Jordan et al. | |
| 8,598,022 B2 | 12/2013 | Kaim et al. | |
| 9,548,181 B2* | 1/2017 | Sinha | H01J 37/3171 |
| 2002/0175144 A1 | 11/2002 | Hung et al. | |
| 2004/0104682 A1 | 6/2004 | Horsky et al. | |
| 2005/0230047 A1* | 10/2005 | Collins | H01J 37/32082 156/345.33 |
| 2006/0060818 A1 | 3/2006 | Tempel et al. | |
| 2006/0081558 A1 | 4/2006 | Collins et al. | |
| 2006/0272775 A1* | 12/2006 | Horsky | C23C 14/48 156/345.37 |
| 2008/0054194 A1* | 3/2008 | Kim | H01J 37/32082 250/492.21 |
| 2008/0135817 A1 | 6/2008 | Luly et al. | |
| 2008/0237496 A1 | 10/2008 | Gupta | |
| 2010/0200954 A1 | 8/2010 | Del Agua Borniquel et al. | |
| 2010/0032639 A1 | 11/2010 | Xu | |
| 2011/0021011 A1 | 1/2011 | Sweeney et al. | |
| 2011/0259366 A1 | 10/2011 | Sweeney et al. | |
| 2012/0108044 A1* | 5/2012 | Kaim | C01B 35/00 438/514 |
| 2012/0118232 A1 | 5/2012 | Colvin et al. | |
| 2012/0119113 A1 | 5/2012 | Colvin et al. | |
| 2012/0252195 A1 | 10/2012 | Jones et al. | |
| 2013/0078790 A1 | 3/2013 | Sweeney et al. | |
| 2013/0137250 A1 | 5/2013 | Olander et al. | |
| 2013/0140473 A1 | 6/2013 | Colvin et al. | |
| 2013/0264492 A1 | 10/2013 | Mayer et al. | |
| 2015/0357152 A1 | 12/2015 | Jones et al. | |

OTHER PUBLICATIONS

IPR2016-01845, Petition for Inter Partes Review of U.S. Pat. No. 8,237,134, filed by Praxair Technology, Inc. on Sep. 19, 2016.

"Ion Implantation Science and Technology," (J. F. Ziegler ed., 2008).

Rendon, et al., "Reducing Arsenic-to-Germanium Cross-Contamination with Isotopically Enriched SDS 72GeF4," IEEE Conference on Ion Implantation Technology (2000).

"Trace Sciences International", Web Page, 2 pages published Jul. 4, 2008, retrieved from Internet Archive Wayback Machine http://web.archive.org/web/20080704121129/http://www.tracesciencs.com/abouttracesciences.html on Oct. 13, 2016).

"Stable Isotopes," Urenco Nederland B.V. Brochure (2006).

\* cited by examiner

Ionization cross-section for B2H6 and BF3 at different energy levels

Different delivery schemes

FIG. 2C

Schematic of an IHC type ion sourc

FIG. 3

Schematic of an ion implant system

FIG. 4

Relative beam current for different gas mix composition. A: 100% $^{11}BF_3$; B: 2.25%Xe/12.75%$H_2$/85%$^{11}BF_3$; C: 2.5% $B_2H_6$/97.5%$BF_3$; D: 5%$B_2H_6$/95%$^{11}BF_3$; E: 5% $B_2H_6$/5%$H_2$/90%$^{11}BF_3$; F: 3%$B_2H_6$/5%$H_2$ 92%$^{11}BF_3$

Cathode and anode weight gain/loss summary

| Dopant Gas Composition | Cathode weight gain/loss rate | Anode weight gain/loss rate |
|---|---|---|
| $^{11}BF_3$ only | +28.5 mg/hr | — |
| $^{11}BF_3$ + Xe/$H_2$ | +1.43 mg/hr | −0.75 mg/hr |
| 97.5% $^{11}BF_3$ + 2.5% $B_2H_6$ | +0.3 mg/hr | −5.1 mg/hr |
| 90% $^{11}BF_3$ + 5% $B_2H_6$ + 5% $H_2$ | −2.5 mg/hr | −1.1 mg/hr |
| 92% $^{11}BF_3$ + 3% $B_2H_6$ + 5% $H_2$ | −0.6 mg/hr | −0.9 mg/hr |

FIG. 7

BORON-CONTAINING DOPANT COMPOSITIONS, SYSTEMS AND METHODS OF USE THEREOF FOR IMPROVING ION BEAM CURRENT AND PERFORMANCE DURING BORON ION IMPLANTATION

RELATED APPLICATIONS

This application is a continuation of allowed U.S. patent application Ser. No. 14/982,544, filed on Dec. 29, 2015, which is a continuation-in-part of U.S. patent application Ser. No. 14/635,413, filed on Mar. 2, 2015, which claims the benefit of priority from U.S. Provisional Patent Application No. 61/947,064 filed on Mar. 3, 2014, the disclosures of which are hereby incorporated herein by reference, in their respective entireties, for all purposes.

FIELD OF INVENTION

The present invention relates to a unique combination of boron-containing dopant compositions, systems and methods of use thereof for improved boron ion implant processes, and particularly an improved beam current without degradation of source life.

BACKGROUND OF THE INVENTION

Ion implantation is an important process in semiconductor/microelectronic manufacturing. The ion implantation process is used in integrated circuit fabrication to introduce dopant impurities into semiconductor wafers. The desired dopant impurities are introduced into semiconductor wafers to form doped regions at a desired depth. The dopant impurities are selected to bond with the semiconductor wafer material to create electrical carriers and thereby alter the electrical conductivity of the semiconductor wafer material. The concentration of dopant impurities that are introduced determines the electrical conductivity of the doped region. Many impurity regions are necessarily created to form transistor structures, isolation structures and other electronic structures, which collectively function as a semiconductor device.

The dopant impurities are generally ions derived from a source dopant gas. An ion-source is used to ionize the dopant gas source into the various dopant ionic species. The ions produce a plasma environment within the ion chamber. The ions are subsequently extracted from the ion chamber in the form of a defined ion beam. The resultant ion beam is typically characterized by a beam current. Generally speaking, a higher beam current can allow more dopant ionic species to be available for implantation into a given workpiece, such as a wafer. In this manner, a higher implant dosage of the dopant ionic species can be achieved for a given flow rate of source dopant gas. The resultant ion beam may be transported through a mass analyzer/filter and then transported to the surface of a workpiece, such as a semiconductor wafer. The desired dopant ionic species of the beam penetrate the surface of the semiconductor wafer to form a doped region of a certain depth with desired electrical and/or physical properties.

Boron implantation has been widely used in the semiconductor industry to modify electrical properties of the doped regions and is recently gaining traction in other applications where desired regions are doped with impurities to tailor certain physical properties of the doped region. The increasing use for boron implant steps during device fabrication is requiring a need for an improved process for implantation of B ions that can offer improved B+ beam current (i.e., sustained or increased beam current generated without shortened ion source life). It should be understood that the terms "B ions", "B active ions", "B ionic species", "B ionic dopant species" and "B+ ions" may be used interchangeably herein and throughout the specification. The ability to implant B ions at an improved B+ beam current will allow end-users to perform increasing boron implant steps with higher equipment throughput and gain productivity improvements.

Boron trifluoride (BF3) is a dopant gas source typically utilized in the semiconductor industry for boron implantation, and used as the benchmark for boron ion implantation performance. However, BF3 has proven limited in its ability to generate B+ ions and thereby establish the higher beam currently demanded by today's applications. In order to increase the generation of B+ ions, the end-user can change various process parameters. For example, the end-user can increase the energy inputted to the ion source, otherwise referred to in the industry as the operating arc voltage of the ion source. Alternatively, the extraction current can be increased. Still further, the flow rate of BF3 introduced into the ion source chamber can be increased. However, such changes in the operation of the ion implant chamber can result in detrimental impact on the ion source components and reduce the ion source lifetime as well as the efficiency of the ion source in generating a stable B+ ion beam during extended operation. A stable B+ ion beam is defined by the uniform beam profile and continuous supply of the B+ ion beam at a desired beam current without interruption that may be caused by beam glitching or drop in beam current output. For example, as the walls of the arc chamber increase in temperature during a typical ion implant process, active fluorine that is released from BF3 can more rapidly etch and erode the tungsten (W) chamber walls, which can cause the cathode (i.e., the source filament of an ion source chamber) to be more susceptible to increased deposition of W-containing deposits. The W-containing deposits reduce the ion source's ability to generate the threshold number of electrons necessary to sustain the plasma and generate B+ ions required to produce the necessary beam current. Additionally, more active fluorine ions are available to propagate the so-called detrimental "halogen cycle" by which increased chemical erosion of the ion source chamber wall and other chamber components can occur. Accordingly, operating the ion source chamber at higher energy levels in an attempt to increase ionization of BF3 to produce the necessary beam current has the potential for shorter ion-source life, thereby rendering this mode of operation undesirable. Additionally, higher flow rates of BF3 tends to produce more active fluorine ions that causes chemical erosion of the ion source chamber wall and undesirable deposition on high voltage components resulting in arcing. These process modifications tend to shorter ion-source life, thereby making such modes of operation undesirable.

Currently, there are no viable techniques for maintaining or increasing the beam current of B+ ion without damaging the ion source chamber components. As such, there remains an unmet need to develop compositions, systems and methods of use thereof to improve the beam current of the desired boron ion species without compromising the ion source life.

SUMMARY OF THE INVENTION

The invention relates, in part, to a composition, system and method of use thereof for improving ion source performance, including an increase in beam current and extension of ion source life. The composition of the dopant gas when operated in a specific manner has been discovered by Applicants to have a significant impact on the ability to improve beam current.

In a first aspect, a method of operating an ion source, comprising: providing a composition comprising B2H6 at a level ranging from about 0.1%-10%; H2 ranging from about 5%-15% and the balance isotopically enriched boron trifluoride in boron mass isotope 11 (11BF$_3$), and further wherein said composition is characterized by the substantial absence of higher order boranes, represented by the general formula BxHy, where x is 3 or greater and y is 7 or greater; introducing the composition into the ion source at a flow rate ranging from about 0.5-5 sccm; operating at an arc voltage that is no greater than 110V; ionizing said composition to produce 11B ions; generating a beam current; and implanting said 11B ions into a substrate.

In a second aspect, a method of operating an ion source, comprising: providing a composition comprising B2H6 at a level ranging from 0.1%-10%; H2 ranging from about 5%-15% and the balance isotopically enriched boron trifluoride in boron mass isotope 11 (11BF$_3$); introducing the composition into the ion source; operating at a power that is less than a corresponding power utilized for 11BF3 when solely used as the dopant gas; ionizing said composition to produce 11B ions; generating a beam current that is substantially the same as or higher than a beam current produced when using 11BF3 solely as a dopant gas; and implanting said 11B ions into a workpiece to achieve a required dosage.

In a third aspect, an ion source apparatus configured to perform boron implantation at an arc voltage that is less than 110V, said ion source adapted to receive about 0.5-5 sccm of a composition comprising B2H6 at a level ranging from 0.1%-10%; H2 ranging from about 5%-15% and the balance isotopically enriched boron trifluoride in boron mass isotope 11 (11BF$_3$), the ion source apparatus characterized by an average glitch rate of no greater than about 2 glitches per min during an ion source life, and the ion source apparatus further characterized by the ion source life of at least 100 hours.

In a fourth aspect, a method of operating an ion source for implanting B ions, comprising: providing a composition comprising B2H6 at a level ranging from 2%-5%; H2 ranging from about 5%-10% and the balance boron trifluoride isotopically enriched in boron mass isotope 11 (11BF$_3$); operating the ion source at an arc voltage between 80-100V; introducing the composition at a flow rate ranging between 0.5-5 sccm directly to an ion source characterized by the absence of vaporizing the composition; ionizing the composition to produce 11B ions; generating a beam current between about 8-13 mA; and operating the ion source for a source life of 200 hours or more having an average glitch rate of less than 1 glitch per min during said source life.

In a fifth aspect, a boron-containing dopant composition for use in an ion implantation process, comprising: a boron-containing dopant gas mixture in a source supply comprising B2H6 from 0.1%-10%; H2 ranging from about 5%-15% and the balance isotopically enriched boron trifluoride in boron mass isotope 11 (11BF$_3$), and further wherein said mixture in the source supply is characterized by no greater than 10,000 ppm of higher order boranes.

BRIEF DESCRIPTION OF THE DRAWINGS

The objectives and advantages of the invention will be better understood from the following detailed description of the preferred embodiments thereof in connection with the accompanying figures wherein like numbers denote same features throughout and wherein.

DETAILED DESCRIPTION OF THE INVENTION

The relationship and functioning of the various elements of this invention are better understood by the following detailed description. The detailed description contemplates the features, aspects and embodiments in various permutations and combinations, as being within the scope of the disclosure. The disclosure may therefore be specified as comprising, consisting or consisting essentially of, any of such combinations and permutations of these specific features, aspects, and embodiments, or a selected one or ones thereof.

"B ions" and "active B ions" as used herein and throughout the specification may be used interchangeably and mean various boron ion dopant species, including boron or boron-containing positive ions such as B+ suitable for implantation into a substrate.

As used herein, unless indicated otherwise, all concentrations are expressed as volumetric percentages ("vol %") based on the total volume of the compositional mixture.

"Reduce" as used herein and throughout the specification is intended to mean shorten, suppress and/or delay during operation of the ion implant process when operating an ion implant source to implant B ions, such as, for example, 11B+ ions or 11BF2+ ions, utilizing the dopant compositions, ion source apparatus and methods of the present invention.

The present disclosure in one aspect relates to novel boron-containing dopant compositions within a certain concentration range along with corresponding apparatus and methods of use thereof for increasing the boron beam current in comparison to conventional boron dopant sources such as BF3. As will be explained, the inventive concept of utilizing a specific lower order diborane species within a certain concentration range to increase the ionization of BF3 without generally contributing to an increase in boron ions and without increasing available F ions is a counterintuitive approach for improving B ion implantation that has not been recognized by the prior art. "Ionization cross-section" is defined as the probability (measured in units of area) that ionization will occur when an atom or molecule undergoes collision with an electron emitted from the ion source. The dopant gas composition, ion source apparatus and methods of the present invention as will be described herein improve the performance of the ion-source in comparison to previous boron dopant source materials (e.g., boron trifluoride isotopically enriched in boron mass isotope 11, 11BF3) without compromising ion source life. Ion source performance takes into consideration key performance metrics that include stability of beam current, source life and the extent of beam glitching. "Beam glitching" or "glitching" as used herein refers to the voltage discharge that can result in momentary drops in the beam current. Glitch rate, which can be expressed as number of glitches per unit time during source life or average number of glitches per unit time, is a metric that can be used to quantify source life. The disclosure is set out herein in various embodiments and with reference to various aspects and features of the invention.

In one embodiment, the present invention has discovered that a specific compositional concentration range of B2H6, BF3 and hydrogen constituents under selective ionization conditions enables an improvement in ion beam current whereby the beam current can be increased without compromising or degrading the ion source. In this manner, an increased boron ion beam current is possible without an accumulation of deposits to an unacceptable level that causes degradation or shortening of the source life.

The boron dopant gas composition enables increased beam current for an extended period of time relative to other conventional source dopant gases typically utilized in boron ion implantation, such as 11BF3. The dopant composition comprises the constituent elements of diborane ($B_2H_6$), boron trifluoride ($BF_3$) and hydrogen ($H_2$) contained in a specific concentration range. In one embodiment, the composition comprises B2H6 ranging from 0.1%-10%, $H_2$ ranging from about 5%-15% and the balance $BF_3$. In a preferred embodiment, the composition comprises B2H6 ranging from 0.1%-5%, $H_2$ ranging from about 5%-10% and the balance $BF_3$. In a more preferred embodiment, the composition comprises B2H6 ranging from 2%-5%, $H_2$ ranging from about 5%-10% and the balance $BF_3$. In a preferred embodiment, the composition comprises B2H6 at about 3%, $H_2$ at about 5% and the balance $BF_3$.

It should be understood that reference to any of the constituent elements of the composition mentioned herein and throughout is intended to mean both its naturally occurring species and its isotopically enriched species. For example, "BF3" is intended to mean BF3 in its naturally occurring form as well as BF3 in its isotopically enriched form beyond natural abundance in a particular isotope, either 10B or 11B. If intended to be limiting, BF3 isotopically enriched above natural abundance in mass isotope 10, by way of example, shall be referred to herein and throughout as 10BF3. BF3 isotopically enriched above natural abundance in mass isotope 11, by way of example, shall be referred to herein and throughout as 11BF3. The term "isotopically enriched" means the dopant gas contains a distribution of mass isotopes different from its naturally occurring isotopic distribution, whereby one of the mass isotopes has an enrichment level higher than present in the naturally occurring level. By way of example, 99% 11BF3 refers to an isotopically enriched or enriched dopant gas containing boron mass isotope 11B at 99% enrichment, whereas naturally occurring BF3 contains boron mass isotope 11B at 80% natural abundance levels. As such, 99% 11BF3 is 19% enriched in B. Additionally, it should be understood that the dopant compositions of the present invention can contain two or more isotopic forms of one or more of the constituent elements. For example, B2H6 can be present in an amount where each of B11 and B10 is present in their natural abundance or enriched levels.

Figure 1:
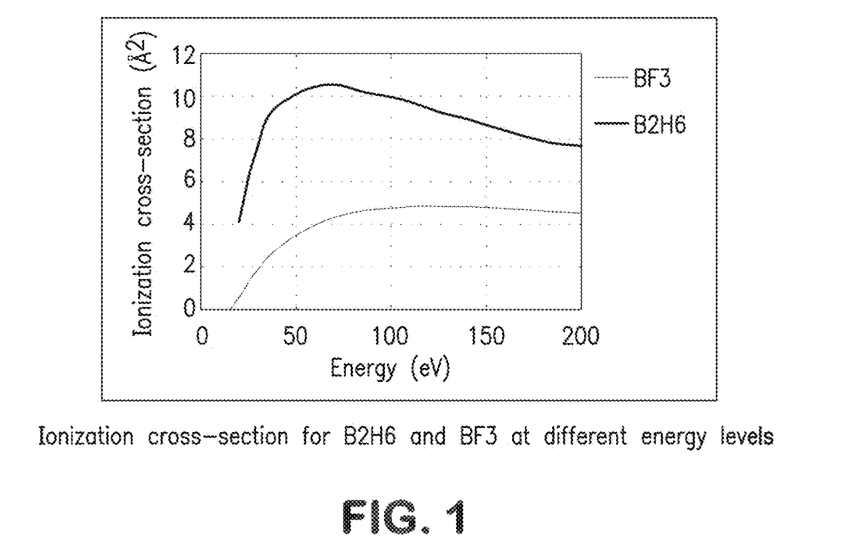
FIG. 1 plots the ionization cross-section for B2H6 and BF3 at different energy levels.

In accordance with the principles of the present invention, the dopant gas composition of the present invention is utilized in an ion implant process at a specific operating regime in which the ionization cross-section of B2H6 is greater than the ionization cross-section of BF3. In this manner, the generation of B ions, such as B+ ions, is improved. Referring to FIG. 1, B2H6 exhibits a higher ionization cross-section than BF3 at the selected operating arc voltages of about 80V-100V, and more preferably about 70V-120V. Within this selected operating regime, Applicants have observed that B2H6 has a higher probability of generating various boron-containing ionic species. The presence of the boron-containing ionic species derived from B2H6 augments the ionization process of BF3 resulting in higher B+ beam current, without degradation of the source filament (i.e., cathode) of the ion source. The net effect is an improvement in the ion beam performance. This improvement in the ion beam performance is exhibited within the predetermined concentration ranges for B2H6 and H2 with balance BF3. B2H6 is within about 0.1%-10%, preferably about 1-5%, more preferably about 2-5% and most preferably about 3%, and the hydrogen concentration is between about 5%-15%, preferably about 5%-10% and most preferably about 5%, with the balance being BF3.

The present invention recognizes that operating the ion implant process in a regime where the ionization cross-section of B2H6 is not greater than the ionization cross-section of BF3 may not create an improvement in the ionization of BF3. As a result, an increase in B ions, and, in turn, B+ beam current, may not be observed.

The amount of B2H6 can neither be below 0.1% nor above 10% in order to avoid deleterious effects. Specifically, the B2H6 must be present at or above its minimum concentration level to reduce the halogen cycle effects so that the rate of cathode filament weight gain is reduced. When the B2H6 is present at a level below 0.1%, insufficient gains in beam current can be observed in conjunction with unacceptably high cathode weight gains by virtue of the halogen cycle.

In addition to maintaining the B2H6 at or above a lower limit of 0.1%, the B2H6 should not exceed an upper limit. It was surprisingly observed that the addition of B2H6 to BF3 increases the production of F+ ions when B2H6 is at levels only approaching 2.5%, despite there being no increase in the addition of fluorine molecules being introduced into the chamber. As will be shown in the working examples, while it was observed that the addition of a mixture of 2.5% B2H6 and 97.5% BF3 reduced the halogen cycle in comparison to a mixture of BF3-Xe—H2, the mixture of 2.5% B2H6 and 97.5% BF3 created unexpected rapid weight loss in the anode region of the ion source compared to BF3-Xe—H2. The term "anode region" as used herein and throughout the specification means the hottest regions of the ion chamber wall. The unexpected weight loss may be occurring as a result of increased production of F+ ions when B2H6 is present at levels approaching 2.5% or more. Without being bound by any particular theory, it is believed the B2H6 ionizes in the ion source to produce different fragments containing radicals and ions of H and BxHy species, respectively. Both H and BxHy species have been discovered by Applicants to play a role as F ion scavengers. BxHy ions and radicals are significantly bulkier than H ions and radicals, and as a result, may have a tendency to transport more slowly in the plasma phase in comparison to lighter species, including H ions. As a result, BxHy may not transport as easily to all locations in the arc chamber thereby reducing its F ion scavenging effects. The inability of BxHy ionic species to disperse into all regions of the chamber can severely impact the operation of the ion source, as the etched-out W from the surfaces of the chamber components can redeposit at undesirable locations via the increased amounts of fluorine available in the halogen cycle. The result is increased tendency for high voltage arcing. Because BxHy ionic species may not occupy certain regions in the ion chamber in appreciable amounts, or may be entirely absent from certain regions in the chamber, F ion etching may be increasing as a result of lower F ion scavenging by the various BxHy ionic species, thereby resulting in increased availability of active F ions, which shortens the ion source life.

Approaches to overcome reduced F ion scavenging during boron implantation have included the addition of a diluent gas mixture to BF3. For example, co-flowing a gas mixture of Xe and H2 has been utilized. However, the increased scavenging of F ions has been achieved only at the expense of lower beam current in comparison to BF3.

The present invention has discovered that a controlled addition of H2 to B2H6 between its lower and upper limits, and the balance BF3 overcomes the deficiencies of F ion scavenging when utilizing BF3 and B2H6, thereby allowing more B2H6 to be added to BF3 without shortening ion source life. For mechanisms that are unknown and not fully understood, the H2, when added within a specific concentration range between about 5%-15%, preferably about 5%-10% and more preferably about 5%, appears to extend ion source life. H2, when added in the prescribed quantities of the present invention, can reduce the availability of active F ions that can etch chamber components. As a result, there is less weight loss of the anode region, and less weight gain of the cathode filament, as will be shown in the working examples. The addition of H2 in a controlled amount to the B2H6 and BF3 allows a greater fraction of B2H6 to be utilized in order to create increased B ion beam current without increased F ion accumulating in the chamber during the ion implant process. As will be shown in the working examples, relative to BF3 only (Comparative Example 1), the preferred compositions (Examples 1-5) of the present invention incorporate up to about 5% H2 to achieve higher beam current with reduced weight gain of the cathode and reduced weight loss or etching of the arc chamber wall. In this manner, the present invention can increase boron ion current while also extending ion source life, both of which until the emergence of the present invention were generally considered competing performance metrics mutually exclusive of one another.

In a preferred embodiment, the inventive mixture of hydrogen, B2H6 and BF3 is characterized by the substantial or entire absence of other inert gases, such as for example argon or xenon. It has been observed that other inert gases may not be required to be added to the inventive mixture of hydrogen, B2H6 and BF3 to aid in the ionization of boron. As such, in the preferred embodiment, the boron-containing composition of the present invention substantially or entirely excludes other inert gases, such as xenon or argon, so as to not reduce beam current. As will be shown in the working examples, Applicants discovered that the inventive mixture of hydrogen, B2H6 and BF3, which is characterized by the substantial or entire absence of other inert gases, increased the beam current approximately 30% in comparison to a mixture of BF3+Xe+H2 (Comparative Example 2, FIG. 5). As such, in one embodiment, the present invention is directed to a method for operating the ion source characterized by the absence of utilizing an inert gas, including, but not limited to, xenon or argon.

Figure 2A:
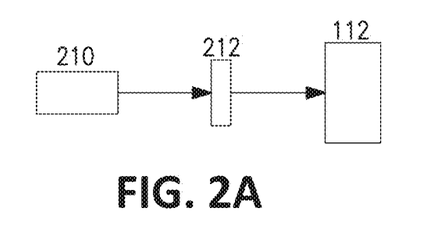
FIGS. 2a, 2b and 2c show[s] different delivery schemes of the dopant gas composition of the present invention.
Figure 2B:
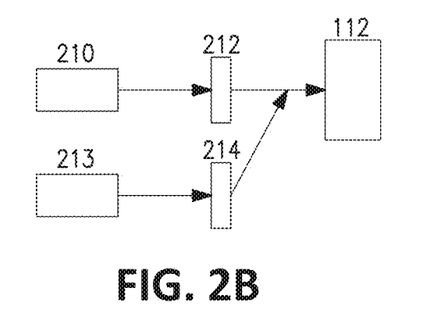
Figure 2C:
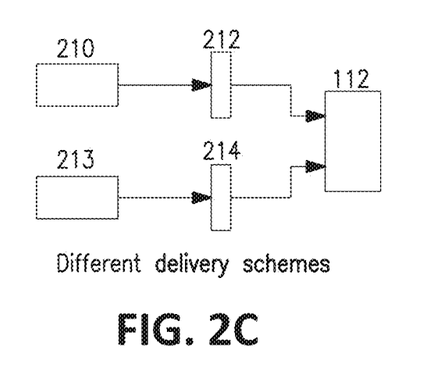

Numerous supply configurations as shown in FIGS. 2a, 2b and 2c can be employed to create the composition of the present invention. In a preferred embodiment, the species can be stored and delivered from a single source as shown in FIG. 2a. Specifically, FIG. 2A shows that the gas composition of the present invention supplied from a single source storage vessel 210 in which the composition is pre-mixed to the concentration levels of the present invention. The single source storage vessel can be stored and delivered using any type of vessel. In a preferred embodiment, a sub-atmospheric Uptime® delivery package can be utilized, as described in U.S. Pat. Nos. 5,937,895; 6,045,115; 6,007,609; 7,708,028; and 7,905,247, all of which are hereby incorporated herein by reference in their respective entireties. The sub-atmospheric delivery device is designed to maintain the dopant mixture in a pressurized state within the device, while minimizing or eliminating the risk of developing a leak or catastrophic rupture that is typically associated with high pressure cylinders. The device is vacuum actuated so as to allow a controlled flow of the dopant mixture to a downstream process when a sub-atmospheric condition is achieved along the discharge flow path.

When the constituents of the present invention are supplied from a single source, the presence of hydrogen at the prescribed amounts in accordance with the present invention can reduce decomposition of mixtures of B2H6 and BF3 to produce higher order boranes, represented by the general formula BxHy, where x is greater than 2 and y is 1 or greater, and more preferably where x is 3 or greater and y is 7 or greater. Some examples of higher order boranes may include B3H7, B5H9, B4H10 or B10H18. Additionally, the chemical stability may be further enhanced by storing the contents at temperatures below ambient conditions, such as in a range from 20 to −30° C. and more preferably from 20 to 4° C.

Alternatively, the dopant composition of the present invention can be created within the ion source chamber by sequentially flowing or co-flowing each of the species. FIG. 2b shows flow control device 212 and 214 can be used to supply a controlled flow of the gas composition and a desired flow from each storage vessel can be premixed in delivery lines before being introduced into the ion source chamber 112. One of the storage vessels may contain one of the constituent gases in pure form. For example, storage vessel 210 contains pure BF3 and storage vessel 213 contains a desired composition of B2H6 and H2 that is premixed. In yet another configuration, FIG. 2c shows the flow from storage vessels 210 and 213 can be separately introduced in the ion source chamber 112 to create the dopant gas composition of the present invention.

Applicants recognize that diborane can polymerize into higher order boranes, whether stored by itself or as part of a mixture, to a degree where ion implantation can be adversely affected. As such, in accordance with one aspect of the present invention, the diborane is introduced into the ion source chamber from a source supply characterized by a substantial absence of higher order boranes (i.e., B3H7 and/or higher) represented by the formula BxHy where x is 3 or greater and y is 7 or greater. A substantial absence of higher order boranes from the source supply is preferably no greater than 10,000 ppm (i.e., 1%). In another embodiment, the diborane is introduced into the ion source chamber from a source supply having no greater than 5000 ppm (i.e., 0.5%) of higher order boranes (i.e., B3H7 and/or higher) represented by the formula BxHy where x is 3 or greater and y is 7 or greater. As such, by limiting the amounts of higher order boranes in the source supply, the methods of the present invention can be utilized without significant degradation of ion performance in terms of beam current and source life. Furthermore, by limiting the amounts of higher order boranes in the source supply, the methods of the present invention are directed to introducing the B2H6, H2 and BF3 composition in a gas phase directly to an ion source that does not include higher order boranes, thereby avoiding the need to vaporize such higher order boranes to generate sufficient vapor pressure.

The source supply can include only diborane. Alternatively, the diborane can include diborane with hydrogen and/or boron trifluoride. More preferably, the diborane is stored and delivered as part of a mixture including hydrogen and boron trifluoride in the prescribed concentration ranges to allow hydrogen to reduce the onset of diborane polymerization and potential degradation of BF3.

Figure 3:
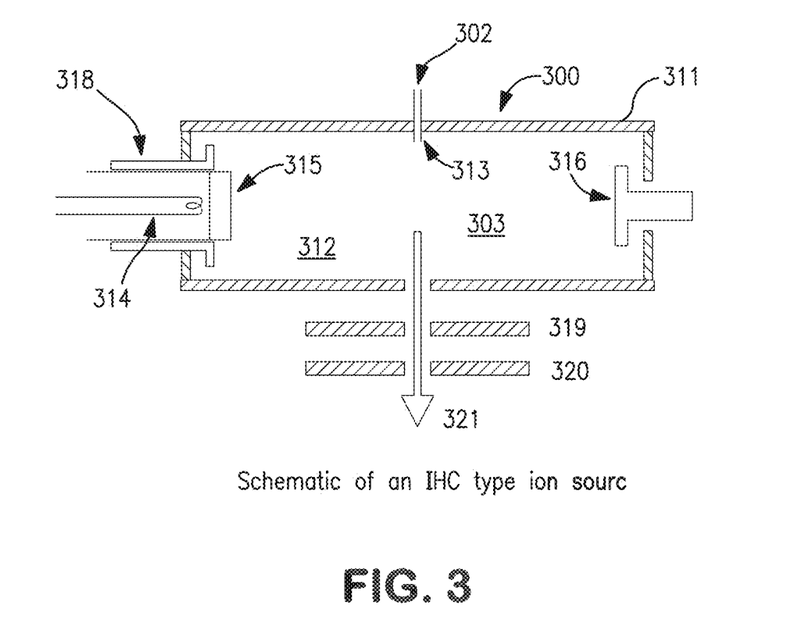
FIG. 3 shows an ion source incorporating the principles of the invention.

Any suitable ion implantation apparatus may be utilized with the present invention. With reference to FIG. 3, a representative ion implantation apparatus 300 is shown for implanting B ions derived from a boron-containing dopant composition of B2H6, BF3 and H2 at the concentration ranges of the present invention. The ion source apparatus 300 depicted in FIG. 3 has various components, including an indirectly heated cathode (IHC) 315, which may serve as the ion source for ionizing the boron-containing dopant gas composition of the present invention into its corresponding boron active ions. It should be understood that the dopant gas composition of the present invention is suitable with other types of ion sources known in the art, including, for example, the Freeman sources, Bernas sources and RF plasma sources.

The ion source apparatus 300 of FIG. 1 can be used for producing an ion beam for implanting boron ions into a semiconductor substrate. The boron ions are generated from ionization of the B2H6 and BF3 in a manner that generates higher boron ion beam current in comparison to a beam current generated solely from BF3. Without being bound by any particular theory, it is believed that under the specific compositional range of the boron-containing dopant composition, and the carefully selected operating conditions of the ion source apparatus 300, the BF3 and B2H6 interact with one another in a synergistic manner to create an ionization mechanism that generates an increased amount of B active ions to produce an increased and improved beam current with lower glitch rate or absence of glitch rate during the source life. "B active ions" as used herein means boron ions having the general formula B+, which is available for implantation.

The dopant gas composition disclosed in the present invention preferably allows the ion source cathode 315 life to be extended compared to conventional boron dopant ion implantation systems, at least in part, on the basis of minimal rate of weight change of the source cathode 315 during the operation of the ion source apparatus 300. The net result is an ion source cathode 315 that is not subject to premature failure, thereby allowing the source cathode 315 to remain operational for an extended period of time to increase throughput. In this manner, the present invention possesses a unique boron-containing dopant gas composition capable of maintaining or increasing boron ion beam current relative to a beam current generated solely from 11BF3 while simultaneously maintaining the integrity of the source filament 315 for a longer duration than previously possible utilizing conventional precursor materials such as 11BF3.

Still referring to the ion source apparatus 300 of FIG. 3, the boron-containing dopant gas composition stream 302 comprises BF3, B2H6 and H2, and is preferably delivered as a single stream contained in a predetermined ratio that is introduced into ion source chamber 312 through a gas feed line extending through the arc chamber wall 311. The boron-containing dopant gas composition 303 inside the source chamber 312 is subject to ionization by applying a predetermined voltage from a power supply source (not shown) to resistively heat a tungsten-based filament 314 positioned in close proximity to the IHC 315. The filament 314 may be negatively biased relative to the IHC 315. A current is applied to the filament 314 through the power supply source to resistively heat the filament 314. An insulator 318 is provided to electrically isolate the cathode 315 from the arc chamber wall 311.

Electrons are emitted by the cathode 315. The emitted electrons accelerate and ionize the B2H6 and BF3 of the boron-containing dopant composition 303 molecules to produce a plasma environment within the chamber 312. The repeller electrode 316 builds up a negative charge to repel the electrons back to sustain ionization of boron-containing dopant composition 303 molecules, thereby maintaining the plasma environment in the arc chamber 312. Repeller electrodes 316 are preferably configured substantially diametrically opposed to the IHC 315 to maintain ionization of the dopant gas composition 303 within the chamber 312. The arc chamber wall 311 includes an extraction aperture 317 through which a well-defined ion beam 321 is extracted from out of the arc chamber 312. The extraction system includes extraction electrode 320 and suppression electrode 319 positioned in front of the extraction aperture 317. Both the extraction and suppression electrodes 320 and 319 have respective apertures aligned with the extraction aperture 317 for extraction of the well-defined ion beam 321 that can be used for boron ion implantation.

Ionization of the boron-containing dopant gas composition 303 may cause generation of a variety of ionized species from a synergistic interaction of each of the constituents of B2H6, BF3 and H2, and any of their corresponding ionic species. Under sufficient operating conditions, including selection of an arc voltage that favorably allows synergistic interaction of B2H6 and BF3 within ion source apparatus 100 by virtue of their corresponding ionization cross-sections at the selected operating arc voltage (FIG. 1) and by controlling the relative amounts of each of the constituents of the boron-containing dopant composition introduced into the ion chamber 312, an increased beam current is produced and sustained for extended periods of time in comparison to conventional boron dopant compositions.

A reduction in the formation of W-containing by-products translates into less diffusion and decomposition of W-containing deposits onto the hotter surfaces of IHC 315. Accordingly, the rate of weight gain of the IHC 315 during operation of the ion source apparatus 300 is substantially reduced as well as the rate of weight loss in the anode region of the chamber. The end result is a lower frequency or elimination of beam glitching, thereby increasing beam stability and extending the operational lifetime of the ion source apparatus 300.

Figure 4:
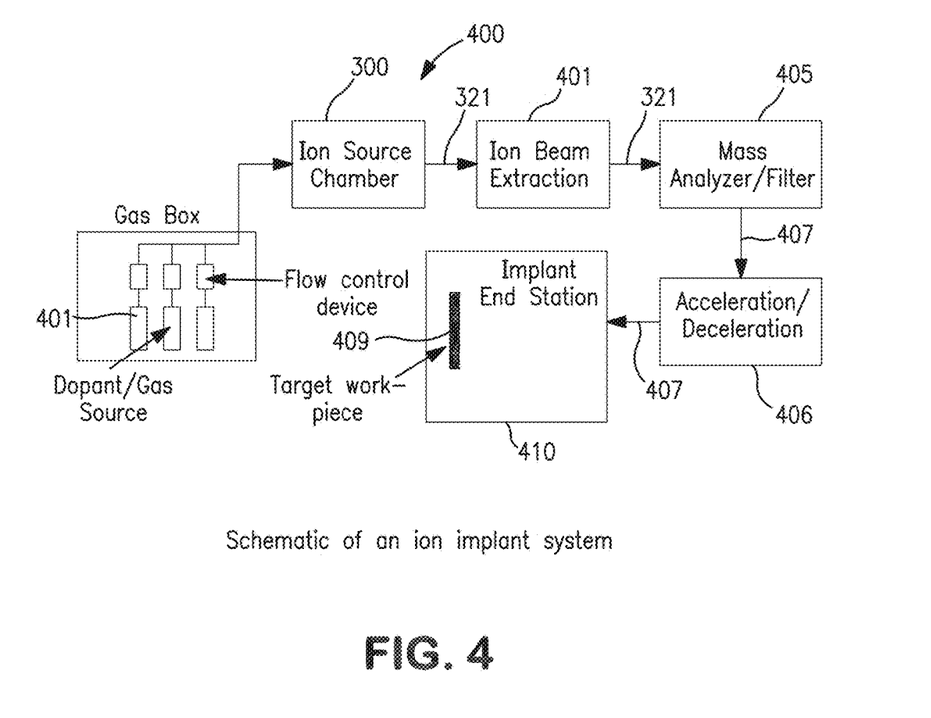
FIG. 4 shows the ion implanter of FIG. 3 within a boron implant system.

FIG. 4 shows the ion source apparatus 100 of FIG. 3 incorporated into ion implant system 400. It should be appreciated by one skilled in the art that that all of the elements of the ion source apparatus 300 of FIG. 3 are incorporated into FIG. 4. As a result, the elements and features of the ion source apparatus 300 shown in FIG. 4 should be understood in relation to the elements and features shown in FIG. 3.

FIG. 4 shows that the dopant gas composition can be supplied form a dopant gas box 401. The dopant gas composition can be provided as a pre-mixed composition in a single supply vessel within gas box 401 at the desired formulation. Alternatively, the gas box 401 may be constructed and arranged such that each of the constituents, $B_2H_6$ and $BF_3$, can be supplied in separate dispensing vessels as part of a gas kit which are then co-flowed or sequentially flowed, continuously or semi-continuously, at controlled flow rates utilizing corresponding flow controllers which may be considered part of the gas kit. Hydrogen can be pre-mixed with $B_2H_6$. The flow rates of $BF_3$ and $B_2H_6$-$H_2$ are controlled and directed towards the ion source apparatus 400 to create the desired boron-containing dopant gas composition at the preferred concentration ranges. Such dopant gas composition can produced at either the inlet to the source chamber 400 and/or therewithin. The location at which the individual constituents mix can occur either upstream of the ion source apparatus 400 or within the chamber 412 of the apparatus 400.

Still referring to FIG. 4, the boron containing dopant gas composition is introduced from box 401 into the ion source apparatus 400 as a pre-mixed single source or as individual species of $BF_3$ and $B_2H_6$-$H_2$ in the manner immediately described above in either a co-flown or sequentially flown manner into the apparatus 300. A voltage is applied to ion source filament 314 as a means for introducing energy into the chamber 312 (FIG. 3) to generate the selected arc voltage of apparatus 300 to ionize the boron-containing dopant gas composition and produce a sufficient concentration of active boron ions available for implantation. Preferably, the energy inputted to the ion source 314 (i.e., arc voltage) is maintained in a range of about 80V-120V so as to enable interaction of the constituents and their corresponding ionic species of the inventive dopant composition in a synergistic manner to create an ionization mechanism that generates an increased amount of active B+ ions. A resultant plasma environment within the chamber 312 is produced. The ion beam extraction system 401 includes extraction electrode 320 and suppression electrode 119 that form part of the boron-containing dopant supply system as shown in FIG. 2 and which are configured for extraction of a well-defined boron beam 321 to be used for boron ion implantation. The beam 321 may be transported through an optional mass analyzer/filter 405 to selectively magnetically capture the boron ion species from other species to be implanted. Specifically, the mass analyzer/filter 405 is arranged to permit only the targeted active boron ions (e.g., 11B) to travel onwards into the process chamber or end station 410. The boron ion beam 407 at this juncture is well-defined in the targeted active boron ions which can be accelerated/decelerated by acceleration/deceleration unit 406 and then transported to the surface of a wafer or target workpiece 409 positioned in an end station 410 for implantation of the active boron ions (e.g., 11B) into the workpiece 409. The active boron ions of the beam collide with and penetrate into the surface of the workpiece 409 at the desired depth to form a region with the desired electrical and physical properties. By employing the process and techniques of this invention, the beam current of the ion source apparatus 300 included within system 400 can be significantly increased over conventional boron ion dopant systems without incurring a drop in ion source life. As such, the present invention represents an advancement in the boron ion implantation industry which, among other process benefits, increases throughput of the ion source apparatus 400.

It should be noted many variations in the structure and design of the boron ion implant process 400 may be employed in different embodiments of the present invention. Furthermore, the details of the construction and design are not important in the performance of the present invention, except insofar as they relate to the boron-containing dopant composition used in the ion source apparatus 300 and corresponding implant process 400.

Additionally, the ion source apparatus 300 can include any of the commonly used ion sources in commercial ion implanters, such as Freeman and Bernas type sources, indirectly heated cathode sources and RF plasma sources. The ion source operating parameters including pressure, filament current and arc voltage, are tuned to achieve desired ionization of the boron-containing dopant gas composition comprising $B_2H_6$ and $BF_3$ such that under the selected parameters, the $B_2H_6$ possesses a higher ionization cross-section compared to $BF_3$, thereby enhancing ionization and generation of active B ions in accordance with principles of the present invention.

The present invention contemplates various ways in which to utilize the mixture of $BF_3$-$B_2H_6$-$H_2$ that is defined by a specific and optimal concentration range so as to significantly improve ion implantation performance. For example, in one aspect of the present invention, and with reference to FIGS. 3 and 4, a specific mixture of $BF_3$-$B_2H_6$-$H_2$ is provided to the ion source chamber 300. Preferably, the mixture is characterized by the substantial absence of higher order boranes $B_xH_y$ where x is greater than 2 and y is greater than 6, thereby avoiding the need to vaporize a mixture including such higher order boranes to generate sufficient vapor pressure. The mixture comprises an optimal concentration range of diborane and hydrogen, namely 0.1-10% $B_2H_6$; and 5-15% $H_2$; with the balance isotopically enriched 11$BF_3$. The mixture is provided to the ion source chamber 300 at a flow rate of 0.5-5 sccm. The power of the ion source is adjusted to be no greater than 110V. Ionization occurs to produce active 11B ions and a beam current is generated. The beam current is extracted from the ion source 300 into ion beam extractor 401 and passes through mass analyzer/filter 405 to create a focused beam of 11B ions. The beam of 11B ions then passes through accelerator/decelerator 406 and finally an implant end station 410 where the 11B ions of the beam penetrates and implants into a substrate at a particular depth therewithin. The generated beam current is preferably greater than a beam current produced with 11$BF_3$ when solely as the dopant gas. In another example, the beam current that is generated is about 8-13 mA, and the ion source is operated to create a glitch rate of no greater than 2 glitches per min, and more preferably no greater than 1 glitch per min, while operating the ion source 300 for a source life of 100 hours or more.

In another embodiment, a method for operating the ion source is provided utilizing a specific mixture of $BF_3$-$B_2H_6$-$H_2$ comprising 0.1-10% $B_2H_6$; 5-15% $H_2$; and the balance isotopically enriched 11$BF_3$ whereby the mixture is characterized by the absence of higher order boranes $B_xH_y$ where x is greater than 2. The mixture is provided to the ion source chamber 300 at a flow rate of 3-4 sccm. When the mixture ionizes, a beam current is generated that is 8-13 mA for a source life of 100 hrs or more and the average glitch rate is less than 1 glitch per min during the source life. The ion source is tuned to an arc voltage greater of 80V or higher, but no greater than 110V.

In another embodiment, a method for operating the ion source is provided utilizing a specific mixture of $BF_3$-$B_2H_6$-$H_2$ at a specific concentration range of 0.1-10% $B_2H_6$; 5-15% $H_2$; and the balance isotopically enriched 11$BF_3$. The mixture is provided at a flow rate of 0.5-5 sccm. The arc voltage to the ion source is set a power level that is 5-10% less than a corresponding arc voltage created with 11$BF_3$ when solely used as the dopant gas. The beam current is generated to be higher than that generated using solely 11BF3. In comparison to 11BF3 when solely used as the dopant gas, the present invention has the ability to increase beam current without decreasing source life, and preferably is able to increase the source life.

Still further, the specific mixture of 0.1-10% B2H6, 5-15% H2 with balance 11BF3 involves operating at a power level that is less than a corresponding power utilized for 11BF3 when 11BF3 is solely used as the dopant gas. A beam current is generated that is substantially the same as or higher than a beam current produced using only 11BF3 as the dopant gas. The beam current contains B active ions which can then be implanted into a workpiece. The ion source performance, as measured with respect to beam current and source life, is improved over conventional B ion processes such as those exclusively employing 11BF3. In one example, the ion source performance is defined at least in part by higher beam current and an ion source life at least 50% longer in comparison to a process using solely 11BF3 as the dopant gas. The ability for the present invention to both increase beam current and source life is unexpected and cannot be explained by any definite mechanism, as typical B ion implantation processes have encountered increased beam current at the expense of shorter ion source life and vice versa. In other words, prior to the present invention, beam current and ion source life were competing design considerations, and even more so for when operating an ion source to implant B ions, as such a process involves fluorine ions and the so-called "halogen cycle" described hereinbefore, which translates into generation and accumulation of deposits during operation.

It has been surprisingly discovered by Applicants that the mixture of BF3-B2H6-H2 at a specific concentration range of 0.1-10% B2H6; 5-15% H2; and the balance isotopically enriched 11BF3 generates all of the active 11B ions substantially from 11BF3, with negligible contribution of active 11B ions from B2H6. This is unexpected considering B2H6 is naturally occurring and therefore includes B in both its 10B and 11B forms. Without being bound by any theory, it is believed that B2H6 at a specific concentration range of 0.1-10% is enhancing the ionization of 11BF3 to create higher amounts of 11B active ions available for implantation without itself ionizing into 10B and 11B ions.

A further benefit to the methods of the present invention is reduced tungsten-based contaminants (W-based contaminants) are generated on or in the substrate (e.g., wafer) relative to the amount generated using only 11BF3. In one example, relative to the amount generated using 11BF3 solely as the dopant gas, the W-based contaminants is at least 40% less when implanting B ions to the required dosage, preferably at least 65% less, and more preferably at least 70% less. The methods of the present invention can also be operated to reduce variation of W-based contaminants from substrate-to-substrate. The ability to noticeably reduce W-based contaminants can significantly improve process control and increase yield relative to conventional processes, such as those employing solely 11BF3 as the dopant gas.

Although higher beam current is possible with the methods of the present invention, the present invention also can be employed in particular instances where beam current needs to remain unchanged. For example, the present invention, in one aspect, can be employed in certain boron implantation recipes to operate at a lower arc current while maintaining substantially the same beam current as previously attained when 11BF3 is solely used as the dopant gas. Arc current refers to the ions within the plasma in the ion chamber. The arc current can be lowered indirectly, by either lowering the filament current and/or lowering the bias voltage to the ion source. The arc voltage remains unchanged. In this manner, the overall power level to the ion source is reduced by lowering arc current as opposed to arc voltage. This method of employing a lower arc current can be beneficial for certain low implantation energy recipes for B ions, such as 11B+ and 11BF2+. It should be understood that high implantation energy recipes can also be operated at lower arc current, such as high implantation energy recipes for 11B+. In this manner, the present invention has the ability to achieve substantially similar beam current at lower arc currents. The benefits of power savings can increase as higher beam current conditions are needed for certain implantation energy recipes.

In another embodiment of the present invention, an ion source apparatus is disclosed that is configured to perform boron implantation in accordance with the methods described herein. The ion source apparatus is capable of being tuned to an arc voltage that is less than 110V. The ion source apparatus is also characterized by an average glitch rate of no greater than about 2 glitches per min during an ion source life adapted to receive about 0.5-5 sccm of a composition comprising B2H6 at a level ranging from 0.1%-40%; H2 ranging from about 5%-15% and the balance isotopically enriched boron trifluoride ($BF_3$) and the composition characterized by the absence of higher order boranes BxHy where x is greater than 2 and y is greater than 6. The boron composition is preferably delivered from a sub-atmospheric delivery package that is in fluid communication with the ion source apparatus. Preferably, the composition is delivered to the ion source without vaporization, as the composition is characterized by the absence of higher order boranes requiring sufficient vaporization.

Applicants have performed several experiments to compare the boron-containing dopant gas compositions of the present invention with other dopant gas materials, as will now be discussed in the Examples below. It should be noted that for all tests described below, the ion source filament weight gain or weight loss and the anode weight gain or weight loss were each measured by taking weight measurements of the ion source filament before and after the test as known in the art. The current was measured using a Faraday cup by standardized techniques well known in the art. Source parameters of arc current, arc voltage, extraction voltage and source pressure were maintained unchanged during the experiments. For purposes of avoiding any doubt, not all of the samples designated as "A"-"F" "in FIG. 5 mean the compositions designated as "A"-"F" in FIG. 6. The exact compositions are listed below FIG. 5 and FIG. 6.

Comparative Example 1 (11BF3)

Figure 5:
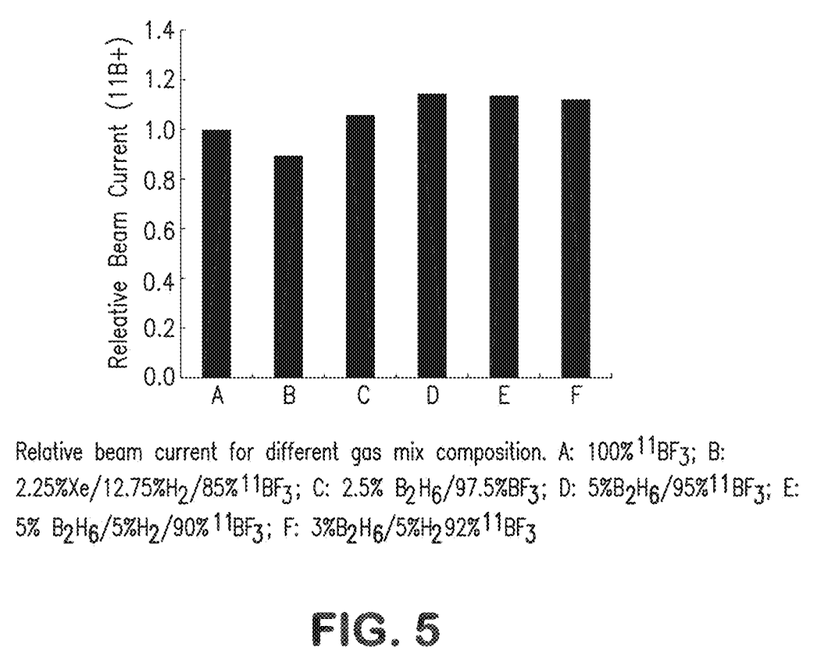
FIG. 5 is a comparison of beam current levels of the dopant gas composition of the present inventions with other types of boron-based dopant gas materials.

An ionization test was performed to evaluate ion beam performance of an ion beam derived from a dopant gas composition of solely 11BF3 (i.e., designated as sample "A" in FIG. 5). The interior of the chamber consisted of an ion source that was constructed to include a helical filament and anode situated perpendicular to an axis of the helical filament. A substrate plate was positioned in front of the anode to keep the anode stationary during the ionization process. The 11BF3 was introduced into the ion source chamber. Voltage was applied to the ion source to ionize the 11BF3 and produce boron ions. The beam current that was measured is shown in FIG. 5.

It was observed that the filament gained weight at a rapid rate and adversely impacted the life time of ion source. In addition, material accumulated in undesirable locations in the ion source. Most of this accumulated deposit consisted of W. This accumulation was attributed to fluorine ions/radicals formed due to dissociation of 11BF$_3$ during ionization in the ion source chamber.

The beam current was considered acceptable for purposes of generating a well-defined boron ion beam that could be used for ion implantation, and as such is normalized to a value of 1.0 against which other tests would be compared. However, a significant cathode filament weight gain rate of 28.5 mg/hr was observed as shown in Table 1. The accumulation of various W-containing deposits on the filament during the test reduced its thermionic emission rate resulting in eventual loss of beam current due to insufficient ionization of the source gas, which required the test to be aborted. These results were believed to be typical of problems encountered with utilizing solely 11BF3 as the B ion dopant source.

Comparative Example 2 (11BF3+Xe/H2)

An ionization test was performed to evaluate the ion beam current obtained from a dopant gas composition in the chamber composed of 11BF3+Xe/H2 (i.e., designated as sample "B" in FIG. 5). The same ion source chamber was utilized as when performing the baseline test in Comparative Example 1. The 11BF3 was introduced into the chamber as a separate source, and the diluent xenon/hydrogen was introduced from another source into the ion source chamber. The 11BF3 and the xenon/hydrogen were introduced in the required amounts to produce the dopant gas composition of 2.25% Xe+12.75% H2+85% 11BF3 within the chamber.

Voltage was applied to the ion source to ionize the dopant composition and produce boron ions. Beam current was normalized against that of 11BF3 from Comparative Example 1 and is shown in FIG. 5. The beam current for Sample B was measured and determined to be about 15% lower than that produced with utilizing only 11BF3, as shown in FIG. 5. A rate of weight gain of 1.43 mg/hr of the cathode filament and a rate of weight loss of −0.75 mg/hr of the anode region were obtained as shown in Table 1. The rate of weight gain of the filament due to deposits was significantly less than that of 11BF3 from Comparative Example 1, indicating less active F ions were available to sustain the halogen cycle and etch additional tungsten chamber components. As a result, the halogen cycle was reduced relative to that of Comparative Example 1. Less beam glitching occurred relative to Comparative Example 1. However, the xenon/hydrogen diluent reduced the halogen cycle and W-containing deposits (Table 1) at the expense of generating a beam current lower than that of utilizing solely 11BF3 (FIG. 5). These results were indicative of conventional boron-containing dopant gas precursors using a diluent gas mixture.

Comparative Example 3 (97.5% 11BF3+2.5% B2H6)

An ionization test was performed to evaluate the ion beam current obtained from a dopant gas composition in the chamber composed of a mixture of 97.5% 11BF3+2.5% B2H6 (i.e., designated as sample "C" in FIG. 5). Pure 11BF3 was flowed from one source, and a mixture of 5% B2H6-11BF3 was flowed from another source. The constituents were introduced into the chamber to form a composition comprising 97.5% 11BF3+2.5% B2H6. The same ion source chamber was utilized as when performing the tests in Comparative Examples 1 and 2.

Voltage was applied to the ion source to ionize the dopant gas mixture and produce boron ions. Beam current was measured and normalized against that of 11BF3, as shown in FIG. 5. The beam current was determined to be higher than either Comparative Examples 1 or 2. However, a rate of weight gain of 0.3 mg/hr of the cathode filament was obtained as shown in Table 1. Additionally, a rate of weight loss of −5.1 mg/hr in the anode region was obtained. The rates of weight gain of the cathode filament and weight loss in the anode region collectively indicated unacceptable shortened ion source life. These results were indicative of conventional boron-containing dopant gas mixtures whereby higher beam current is obtained at the expense of shorter ion source life.

Comparative Example 4 (5% B2H6+95% 11BF3)

An ionization test was performed to evaluate the ion beam current obtained from a dopant gas composition in the chamber composed of a mixture of 95% 11BF3+5% B2H6 (i.e., designated as sample "D" in FIG. 5). The same ion source chamber was utilized as when performing the tests in the other Comparative Examples. The dopant gas composition was pre-mixed and introduced from a single source into the chamber.

Voltage was applied to the ion source to ionize the dopant gas composition and produce boron ions. Beam current was measured and normalized against that of 11BF3. The beam current was determined to be higher than Comparative Examples 1, 2 and 3.

Source life data was not collected, as it was expected that Sample D of FIG. 5 would exhibit a source life equivalent to or worse than the source life of Sample C of FIG. 5, which was already determined to be unacceptable. These results are indicative of conventional boron-containing dopant mixtures, whereby higher beam current is obtained at the expense of shorter ion source life.

Comparative Example 5 (11BF3 at 100V)

Figure 6:
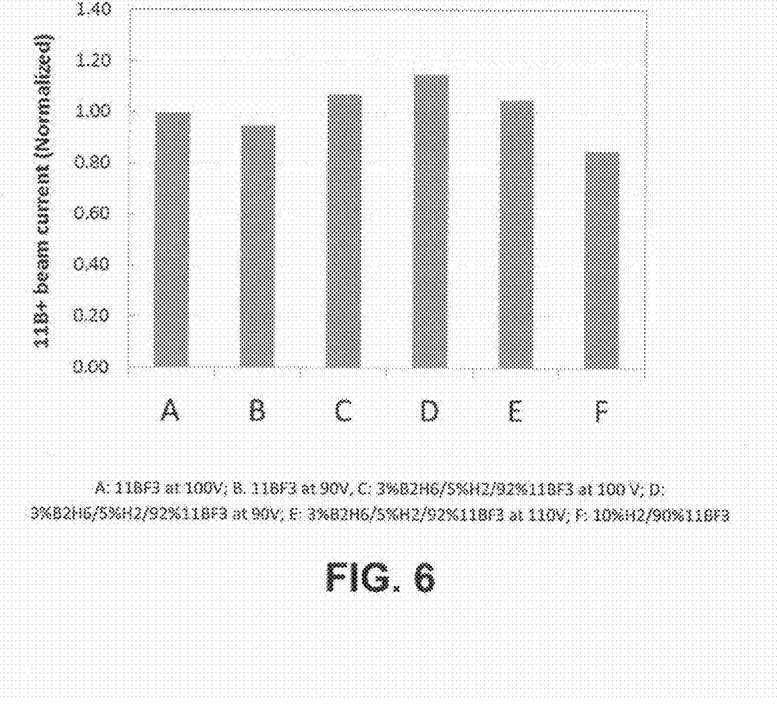
FIG. 6 is a bar plot comparison of beam current levels and power levels of the dopant composition of the present invention with other types of boron-based dopant gases.
Figure 7:
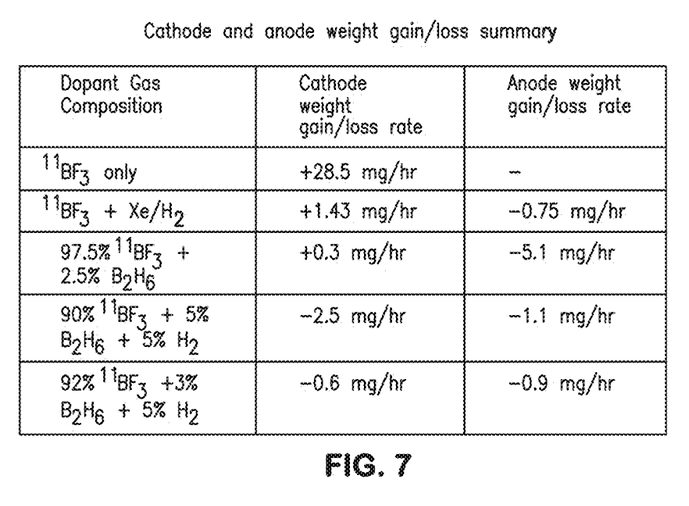
FIG. 7 shows cathode weight gain, cathode weight loss, anode weight gain and anode weight loss for different boron-containing dopant gases.

An ionization test was performed to evaluate ion beam performance of an ion beam derived from a dopant gas composition of 11BF3 only (i.e., designated as sample "A" in FIG. 6). The interior of the chamber consisted of an ion source that was constructed to include a helical filament and anode situated perpendicular to an axis of the helical filament. A substrate plate was positioned in front of the anode to keep the anode stationary during the ionization process. The 11BF3 was introduced into the ion source chamber. Voltage was applied at 100V to the ion source to ionize the 11BF3 and produce boron ions. The beam current that was measured is shown in FIG. 6 as "A", and represents the baseline against which all other tests were evaluated.

Comparative Example 6 (90% 11BF3+10% H2 at 100V)

An ionization test was performed to evaluate the impact of arc voltage for an ion beam performance of an ion beam derived from a dopant gas composition of 90% 11BF3 and 10% H2 (i.e., designated as sample "F" in FIG. 6). The interior of the chamber consisted of an ion source that was constructed to include a helical filament and anode situated perpendicular to an axis of the helical filament. A substrate plate was positioned in front of the anode to keep the anode stationary during the ionization process. The 90% 11BF3 and 10% H2 was introduced into the ion source chamber.

Voltage was applied at 100V to the ion source to ionize the 11BF3 and produce boron ions. The beam current that was measured is shown in FIG. 6. Source life was comparable to that of sample "A" of FIG. 6. 90% 11BF3 and 10% H2 exhibited the lowest beam current, as shown in FIG. 6. The beam current was almost 20% less than 11BF3 ("A") and over 20% lower than the beam current created by the present invention (Compositions "C", "D" and "E"). The results clearly signify the positive impact that a prescribed amount of diborane in Compositions "C", "D" and "E" can have on the ion performance.

Comparative Example 7 (11BF3 at 90 V)

An ionization test was performed to evaluate the impact of arc voltage on ion beam performance of an ion beam derived from a dopant gas composition of 11BF3 only (i.e., designated as sample "B" in FIG. 6). The interior of the chamber consisted of an ion source that was constructed to include a helical filament and anode situated perpendicular to an axis of the helical filament. A substrate plate was positioned in front of the anode to keep the anode stationary during the ionization process. The 11BF3 was introduced into the ion source chamber. Voltage was applied at 90V to the ion source to ionize the 11BF3 and produce boron ions. The beam current that was measured is shown in FIG. 6 normalized against "A". The beam current was less than 11BF3 ("A"), as would be expected with conventional boron-containing dopant gases.

Example 1 (5% B2H6+5% H2+90% 11BF3)

An ionization test was performed to evaluate to evaluate the ion beam current obtained from a boron-containing dopant gas composition in the chamber composed of 5% B2H6+5% H2+90% 11BF3 (i.e., designated as sample "E" in FIG. 5). The same ion source chamber was utilized as when performing the tests of Comparative Examples 1-6. The composition was pre-mixed into a single delivery vessel and delivered therefrom to the ion source chamber.

Voltage was applied to the ion source to ionize the boron dopant gas composition and produce boron ions. Beam current was measured and normalized against that of 11BF3 (Comparative Example 1). Beam current was determined to be higher than that produced when utilizing the 11BF3.

A rate of weight loss of −2.5 mg/hr of the cathode filament and −1.1 mg/hr in the anode region was obtained as shown in Table 1. This sample exhibited less weight change than any of the Comparative Examples. This composition also produced increased beam current and sustained the higher beam current without shortening the ion source life.

Example 2 (3% B2H6+5% H2+92% 11BF3)

An ionization test was performed to evaluate the ion beam current obtained from a boron-containing dopant gas composition composed of 3% B2H6+5% H2+92% 11BF3 (i.e., designated as sample "F" in FIG. 5). The same ion source chamber was utilized as when performing the tests of Comparative Examples 1-6. The composition was pre-mixed into a single delivery vessel and delivered therefrom to the ion source chamber.

Voltage was applied to the ion source to ionize the boron dopant gas composition and produce boron ions. Beam current was measured and normalized against that of 11BF3 (Comparative Example 1). Beam current was determined to be higher than that produced when utilizing 11BF3.

A rate of weight loss of −0.6 mg/hr of the cathode filament and −0.9 mg/hr in the anode region was observed, as shown in Table 1. These source life data values indicate that the composition of Sample F was able to sustain the higher beam current without shortening ion source life.

Examples 1 and 2 demonstrated an increased quality in the ion beam relative to the Comparative Examples 1-4. The invention demonstrates that the etching of W-containing chamber components is significantly reduced when using the boron-containing dopant gas composition of the present invention. Reduction of deposits reduces or eliminates beam instability and eventual beam glitching, thereby improving the boron beam current during source life of the ion chamber. Furthermore, unlike prior art methods, the compositions, systems and methods of use thereof for the present invention can increase the beam current without compromising, degrading or shortening the ion source life. Increased quality of boron beam current coupled with extended ion source can increase throughput and provides an opportunity for reducing cycle time to achieve the required dopant dosage of the process workpieces.

Example 3 (3% B2H6+5% H2+92% 11BF3 at 100V)

An ionization test was performed to evaluate the impact of arc voltage on an ion beam current obtained from a boron-containing dopant gas composition in the chamber composed of 3% B2H6+5% H2+92% 11BF3 (i.e., designated as sample "C" in FIG. 6). The same ion source chamber was utilized as when performing the tests of Comparative Examples 1-6. The composition was pre-mixed into a single delivery vessel and delivered therefrom to the ion source chamber.

Voltage was applied at 100V to the ion source to ionize the boron dopant gas composition and produce boron ions. Beam current was measured and normalized against that of 11BF3 in FIG. 6 ("A", Comparative Example 5). Beam current was determined to be higher than that produced when utilizing the 11BF3. Source life was not sacrificed as a result of the increased beam current.

Example 4 (3% B2H6+5% H2+92% 11BF3 at 90V)

An ionization test was performed to evaluate the impact of arc voltage on ion beam current obtained from a boron-containing dopant gas composition in the chamber composed of 3% B2H6+5% H2+92% 11BF3 (i.e., designated as sample "D" in FIG. 6). The same ion source chamber was utilized as when performing the tests of Comparative Examples 1-6. The composition was pre-mixed into a single delivery vessel and delivered therefrom to the ion source chamber.

Voltage was applied at 90V to the ion source to ionize the boron dopant gas composition and produce boron ions. Beam current was measured and normalized against that of 11BF3 in FIG. 6 ("A" of Comparative Example 5). Beam current was determined to be higher than that produced when utilizing the 11BF3. Of particular significance, it was unexpectedly discovered that the beam current actually increased when the arc voltage was reduced from 100V (Sample "C" of Example 3) to 90V (Sample "D" of Example 4). In fact, "D" exhibited the highest beam current of the compositions tested in FIG. 6. This was a counterintuitive result, as a reduction in arc voltage has led to a reduction in beam current for conventional gases, which was shown with 11BF3 ("A" and "B" of FIG. 6). Source life was not sacrificed as a result of the increased beam current, as minimal weight change was observed at the cathode filament and the anode region, thereby indicating the ability to sustain source life at higher beam currents.

Example 5 (3% B2H6+5% H2+92% 11BF3 at 110V)

An ionization test was performed to evaluate the impact of arc voltage on ion beam current obtained from a boron-containing dopant gas composition in the chamber composed of 3% B2H6+5% H2+92% 11BF3 (i.e., designated as sample "E" in FIG. 6). The same ion source chamber was utilized as when performing the tests of Comparative Examples 1-6. The composition was pre-mixed into a single delivery vessel and delivered therefrom to the ion source chamber.

Voltage was applied at 110V to the ion source to ionize the boron dopant gas composition and produce boron ions. Beam current was measured and normalized against that of 11BF3 in FIG. 6 (Comparative Example 5). Beam current was determined to be higher than that produced when utilizing the 11BF3. Beam current was lower than "C" (100V) and even more lower than "D" (90V) further confirming the unexpected behavior of the present invention in which a reduction in arc voltage results in a higher beam current. Source life was not sacrificed as a result of the increased beam current, as minimal weight change was observed at the cathode filament and the anode region, thereby indicating the ability to sustain source life at higher beam current.

The ability of the present invention to generate higher beam current at lower power levels at energy levels in which B2H6 has a higher ionization cross-section than BF3 without disrupting source life relative to the performance of conventional 11BF3 is a novel breakthrough. Prior to the emergence of the present invention, increased beam current required increased power. And, further, prior to the emergence of the present invention, higher beam current was obtained at the expense of shorter source life, and, as such, had been viewed as competing design considerations.

From an ionization standpoint, Examples 1-5 demonstrate that specific boron-containing compositions of the present invention can generate boron active ions and an increased beam current without degradation of the ion source. In particular, a mixture of B2H6, BF3 and H2 within preferred concentration ranges of the present invention at selected arc voltage operating conditions facilitates interaction with one another in a synergistic manner to create a boron ionization mechanism which can generate an increased amount of active boron ions at least about equal to the simple additive effect of total boron ions available from individually ionizing B2H6 and BF3. The net effect is an improvement of the boron beam current in comparison to conventional systems and methods employing conventional boron precursor materials.

Additionally, the present invention can overcome the drawbacks of conventional boron ion implant systems and methods which require a diluent gas mixture such as Xe/H2 for the purpose of reducing deposits. Diluent gas mixtures tend to reduce the active number of boron ions available per unit gas flow into the ion source chamber, thereby reducing throughput. Accordingly, this so-called "dilution effect" typically encountered with conventional boron dopant compositions employing a diluent gas mixture is eliminated in the present invention, as the present invention does not rely on incorporation of a diluent gas mixture for extending source life.

The present invention also offers other process benefits. For example, the increased beam current attainable in the present invention can eliminate the requirement of any additional gas stick (e.g., flow control device, pressure monitoring device, valves and electronic interface), and therefore offers a significant reduction in capital expense associated with utilizing additional gas sticks.

While it has been shown and described what is considered to be certain embodiments of the invention, it will, of course, be understood that various modifications and changes in form or detail can readily be made without departing from the spirit and scope of the invention. It is, therefore, intended that this invention not be limited to the exact form and detail herein shown and described, nor to anything less than the whole of the invention herein disclosed and hereinafter claimed.

The invention claimed is:

1. A boron-containing dopant composition for use in an ion implantation process, comprising:
   diborane (B2H6) from 0.1%-10%;
   hydrogen (H2) ranging from about 5%-15%; and
   the balance being isotopically enriched boron trifluoride in boron mass isotope 11 (11BF$_3$);
   wherein said composition is characterized by no greater than 10,000 ppm of higher order boranes.

2. The boron-containing dopant composition for use in an ion implantation process of claim 1, wherein the B2H6 and H2 are supplied as a mixture in a first supply source, and the 11BF3 is supplied in a second supply source.

3. The boron-containing dopant composition for use in an ion implantation process of claim 1, wherein the B2H6 and 11BF3 are supplied as a mixture in a first supply source, and the H2 is supplied in a second supply source.

4. The boron-containing dopant composition for use in an ion implantation process of claim 1, wherein the B2H6, H2 and 11BF3 is supplied as a mixture in a single supply source.

5. The boron-containing dopant composition for use in an ion implantation process of claim 1, wherein said B2H6 is isotopically enriched above natural abundance level.

6. The boron-containing dopant composition for use in an ion implantation process of claim 1, wherein said boron-containing dopant composition is produced at either an upstream location of the ion chamber and/or within the ion chamber.

7. A boron-containing dopant composition for use in an ion implantation process, comprising isotopically enriched boron trifluoride in boron mass isotope 11 (11BF3) configured to be supplied in a supply vessel wherein said 11BF3 is characterized by no greater than 10,000 ppm of higher order boranes and further wherein said supply vessel comprises hydrogen (H2).

8. The boron-containing dopant composition for use in an ion implantation process of claim 7, wherein said 11BF3 is supplied as part of a gas kit, said gas kit comprising a separate supply vessel comprising B2H6.

9. The boron containing dopant composition of claim 7, wherein said supply vessel is configured into a gas box.

10. The boron containing dopant composition of claim 7, wherein said supply vessel is a sub-atmospheric delivery package that is in fluid communication with an ion source apparatus configured to be operated to generate boron active ions, said ion source apparatus characterized by an average glitch rate of no greater than about 2 glitches per min during an ion source life.

11. The boron-containing dopant of claim 7, further characterized by the absence of a diluent gas.

12. The boron containing dopant composition of claim 10, wherein said supply vessel is a sub-atmospheric delivery package that is in fluid communication with an ion source apparatus configured to be operated to generate boron active ions, said ion source apparatus characterized by an average glitch rate of no greater than about 2 glitches per min during an ion source life of at least 100 hours.

13. A boron-containing dopant composition gas for use in an ion implantation process, comprising:
- a gas storage and dispensing vessel comprising said boron-containing dopant composition gas mixture;
- said boron-containing dopant composition gas mixture comprising:
- isotopically enriched boron trifluoride in boron mass isotope 11 (11BF3); and
- hydrogen, wherein said gas mixture is characterized by no greater than 10,000 ppm of higher order boranes;
- further wherein said gas storage and dispensing vessel is configured into a gas box that is operably connected to an ion source apparatus to implant active boron ions.

14. The boron-containing dopant composition gas of claim 13, characterized by the substantial or entire absence of xenon or argon.

\* \* \* \* \*